United States Patent [19]

Hekimian

[11] 3,838,351

[45] Sept. 24, 1974

[54] ACTIVE NOTCH FILTER AND DUAL MODE FILTER/OSCILLATOR

[75] Inventor: Norris C. Hekimian, Rockville, Md.

[73] Assignee: Hekimian Laboratories, Inc., Rockville, Md.

[22] Filed: July 13, 1973

[21] Appl. No.: 378,888

Related U.S. Application Data

[63] Continuation-in-part of Ser. No. 178,108, Sept. 7, 1971, abandoned.

[52] U.S. Cl. .................... 330/104, 330/103, 330/69

[51] Int. Cl. .............................................. H03f 3/68

[58] Field of Search ............ 330/30 D, 69, 104, 103

[56] References Cited

UNITED STATES PATENTS

| | | | |
|---|---|---|---|
| 3,370,247 | 2/1968 | Hoffman et al. | 330/103 X |
| 3,579,150 | 5/1971 | Badessa | 330/104 X |

*Primary Examiner*—Nathan Kaufman

*Attorney, Agent, or Firm*—Rose & Edell

[57] ABSTRACT

A high-Q active notch filter includes only one operational amplifier employing resistive positive feedback and reactive negative feedback. The positive feedback resistance can be selectively changed to convert the notch filter to an oscillator operating at the notch frequency.

9 Claims, 3 Drawing Figures

ACTIVE NOTCH FILTER AND DUAL MODE FILTER/OSCILLATOR

CROSS REFERENCES TO RELATED APPLICATION

This application is a continuation-in-part of my copending U.S. Pat. Application Ser. No. 178,108, filed on Sept. 7, 1971, and now abandoned and entitled "Active Notch Filter."

BACKGROUND OF THE INVENTION

The present invention relates to notch filters, and in particular to a high-Q active notch filter utilizing only one operational amplifier. In addition, the present invention relates to a notch filter circuit which is capable of being switched to an oscillatory mode at the notch frequency.

The operational amplifier, with its high gain, high input impedance and low output impedance offers considerable advantages when employed in active filters. Heretofore, however, active notch filters employing an operational amplifier have been severely limited in attainable Q-factor.. Q-factor improvement has been achieved only with the use of more than one operational amplifier. The additional operational amplifiers increase the cost of the filter as well as the complexity of the circuit.

An example of a prior art operational amplifier notch filter is described in "The design of an Operational Amplifier Notch Filter" by R. J. Harris in Proceedings of the I.E.E.E. (Letters), Volume 66, pages 1722–1723, Oct. 1968. Harris sets forth a circuit utilizing two operational amplifiers to achieve a relatively high Q-factor; however, upon analysis it may be shown that Harris cannot obtain a zero signal transmission condition at the notch frequency without also obtaining an infinite Q-factor. The latter, of course, is obtainable only in theory and not in practice. Consequently, Harris provides an increased Q by compromising attenuation at the notch frequency.

In an article entitled "A Single Operational Amplifier Notch Filter" by R. M. Inigo, appearing in Proceedings of the I.E.E.E. (Letter), Volume 57, page 727, 1969, a circuit is described which is purported to be an equivalent filter to that disclosed by Harris but which requires only one operational amplifier. On careful analysis, however, Inigo's filter can achieve a Q-factor no greater than 0.5. More specifically, and referring to Inigo's filter as illustrated in FIG. 1, input signal is applied to the inverting input terminal (−) of operational amplifier 10 via series resistor $R_A$ and parallel resistor $R_B$. Negative feedback from the amplifier output terminal is applied to the (−) input terminal via resistor $R_C$. Input signal is also applied to the non-inverting input terminal (+) of amplifier 10 through a series circuit comprising resistor $R_X$ and capacitor $C_X$, and across a parallel RC circuit comprising resistor $R_Y$ and capacitor $C_Y$. Assuming a very high gain for operational amplifier 10, the following expression may be shown to represent the overall circuit gain as a function of frequency:

$$\frac{V_o}{V_I}=\frac{a}{b}\left[\frac{1+p\left(T_1+T_2+\frac{R_Y}{R_x}T_1-\frac{R_2}{aR_x}T_1\right)+p^2T_1T_2}{1+p\left(T_1+T_2+\frac{R_Y}{R_x}T_1\right)+p^2T_1T_2}\right] \quad (1)$$

where:

$p = J\omega;$ $T_1 = R_xC_x;$ $T_2 = R_YC_Y;$ $a = (R_BR_C)/(R_AR_B+R_AR_C+R_BR_C)$; and $b = (R_AR_B)/(R_AR_B+R_AR_C+R_BR_C)$ It may also be shown that the natural frequency $\omega_n$ of the circuit is $$\omega_n = 1/\ \sqrt{T_1T_2} \quad (2)$$

and that the quality factor, Q, of the circuit is $$Q = 1/\omega_n[T_1 + T_2 + (R_y/R_x)T_1] \quad (3)$$

$$= \sqrt{T_1\ T_2}/(T_1 + T_2 + (R_Y/R_x)T_1) \quad (4)$$

As a function of $T_1$ and $T_2$, $Q$ is obviously maximum when $(R_y/R_x) = 0$.

For this limiting case $$Q_{max} = \ \sqrt{T_1T_2}/T_1+T_2 \approx 1/2. \quad (5)$$

Therefore, Inigo's circuit can provide notches with $Q$ no greater than ½. The sharpness of the filter notch is thus quite limited and not useful for many applications.

It is therefore an object of the present invention to provide a notch filter which is capable of achieving very high values of $Q$ while employing a single operational amplifier.

A convenient approach to signalling via a voice channel (i.e. — telephone line, radio link, etc.) is the use of a signal tone which is turned on or off for different signalling conditions. For such signalling it is important that the signalling tone be transmitted only when intended for signalling and not result from extraneous sources such as casual voice excitation. The brute force approach to such signalling is to provide a keyed oscillator which is activated when it is desired to turn the signalling tone on. In addition, a gated notch filter may be employed to prevent passage of an extraneously-derived tone at the signalling frequency during off times for the oscillator. It is desirable to avoid the expense introduced by using both an oscillator and a notch filter without impairing the reliability of signalling.

Ir is therefore another object of the present invention to provide an active notch filter which can be readily switched to an oscillatory operational mode, whereby the signalling tone can be generated in the oscillatory mode and blocked by the same circuit in its notch filter mode.

SUMMARY OF THE INVENTION

According to the present invention, a notch filter employs a single operational amplifier with a resistive regenerative feedback path and an RC degenerative feedback path. The resistive regenerative feedback path permits high Q-factors to be obtained, depending upon the choice of feedback resistance. The RC degenerative feedback path,, combined with an input RC circuit connected to the inverting input terminal of the amplifier, determines the notch frequency.

I have also found that the notch filter can be switched to an oscillatory mode by selectively lowering the resistance in the regenerative feedback path. In a preferred embodiment the regenerative feedback path in the notch filter circuit is selectively shunted with another resistance to render the circuit oscillatory at the notch frequency.

BRIEF DESCRIPTION OF DRAWINGS

The above and still further objects, features and advantages of the present invention will become apparent upon consideration of the following detailed description of one specific embodiment thereof, especially when taken in conjunction with the accompanying drawings, wherein.

Further 3 is a schematic diagram of a circuit capable of being switched between notch filter and oscillatory operational modes.

DESCRIPTION OF THE PREFERRED EMBODIMENT

Figure 1:
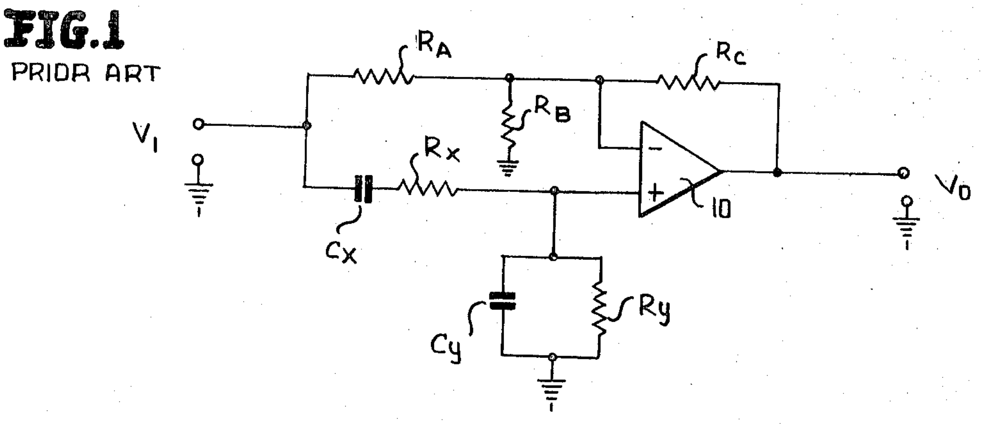
FIG. 1 PRIOR ART
FIG. 1 is a schematic diagram of a prior art notch filter circuit.
Figure 2:
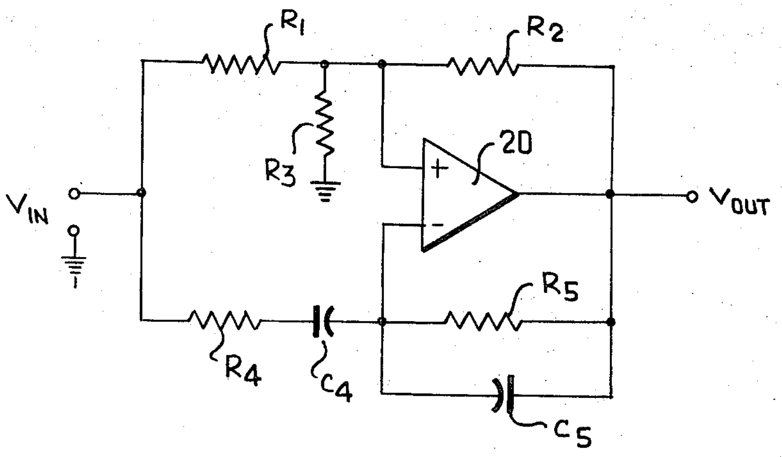
FIG. 2 is a schematic diagram of a notch filter circuit according to the present invention.

Referring specifically to FIG. 2 of the accompanying drawings, the filter of the present invention includes an operational amplifier 20 of standard configuration, such as Motorola Corporation Model MC1458. Suitable bias voltages (not shown) are employed for proper amplifier operation. The amplifier includes a non-inverting input terminal (+), an inverting input terminal (−), and an output terminal. Input signal $V_{in}$ is applied to non-inverting input terminal (+) through series resistor R1 and across parallel resistor R3. A positive or regenerative feedback resistor R2 is connected between the amplifier output terminal and the non-inverting input terminal (+).

Input signal $V_{in}$ is split and also applied to inverting input terminal (−) through series-connected resistor R4 and capacitor C4. Negative or degenerative feedback is obtained between the amplifier output terminal and inverting input terminal (−) via parallel-connected resistor R5 and capacitor C5.

The notch filter of FIG. 2 has a notch whose sharpness is determined by resistors R1, R2 and R3. That is, the quality factor of the circuit is determined by these resistors and is, in theory, limitless. Of course, in practice, infinite values of Q are not attainable due to the inherent variations of components from ideal. Nevertheless, a wide range of Q factors are attainable with this circuit, as indicated by the mathematical analysis set forth below.

The circuit gain may be represented as follows:

$$\frac{V_{out}}{V_{in}}=\left[\frac{A}{1-B}\right]\cdot\left[\frac{1+p\left(T4+T5-\frac{R5}{R4}T4\left[\frac{1-A}{A}\right]\right)+p^2T4\cdot T5}{1+p\left(T4+T5-\frac{R5}{R4}T4\left[\frac{B}{1-B}\right]\right)+p^2T4\cdot T5}\right] \quad (6)$$

where:

$p = j\omega$:

$A = (R2)(R3)/(R1)(R2)+(R1)(R3)+(R2)(R3)$ $B = (R1)(R3)/(R1)(R2)+(R1)(R3)+(R2)(R3)$ $T4 = (R4)(C4)$; and $T5 = (R5)(C5)$.

The natural frequency of this circuit is given by the expression $$\omega_n = 1/\sqrt{T4 \cdot T5}. \quad (7)$$

From this it may be shown that the quality factor, Q, is given by the expression $$Q = 1/\omega_n[T4+T5 - R5/R4\ T4\ (B/1-B)] \quad (8)$$

$$Q = \sqrt{T4 \cdot T5}/T4+T5 - (R5/R4)T4(B/1-B) \quad (9)$$

As a function of B, Q is obviously a minimum when $(R5/R4)T4(B/1-B)=0$. Thus, depending in part upon B, the value of $Q$ can be made quite large. To obtain a true null at the notch frequency and assuming $T4 = T5$ and $R4 = R5$ for convenience, A should be exactly one-third and B should be approximately two-thirds. Values of $Q$ in excess of 10 are readily realizable.

The following table lists typical component values employed in one working embodiment of the circuit of FIG. 2:

| | |
|---|---|
| R1 | 3.65K |
| R2 | 2K |
| R3 | 24.3K |
| R4 | 13K |
| R5 | 13K |
| C4 | .01 uf |
| C5 | .01 uf |

The listed component values are intended to be representative of one embodiment Only and not limiting on the invention.

An important aspect of the notch filter of the present invention resides in the fact that by proper choice of component values, filters having sharp notches (high Q) intermediate notches (medium Q) or broad notches (low Q) may be easily designed.

Another important aspect of the notch filter of the present invention is that its basic design renders it operable in both a notch filter mode and an oscillatory mode. A dual mode circuit of this type has particularly valuable utility for signalling in voice channels as described in the BACKGROUND OF THE INVENTION section herein. Such a dual mode circuit is illustrated in FIG. 3 of the accompanying drawings.

Figure 3:
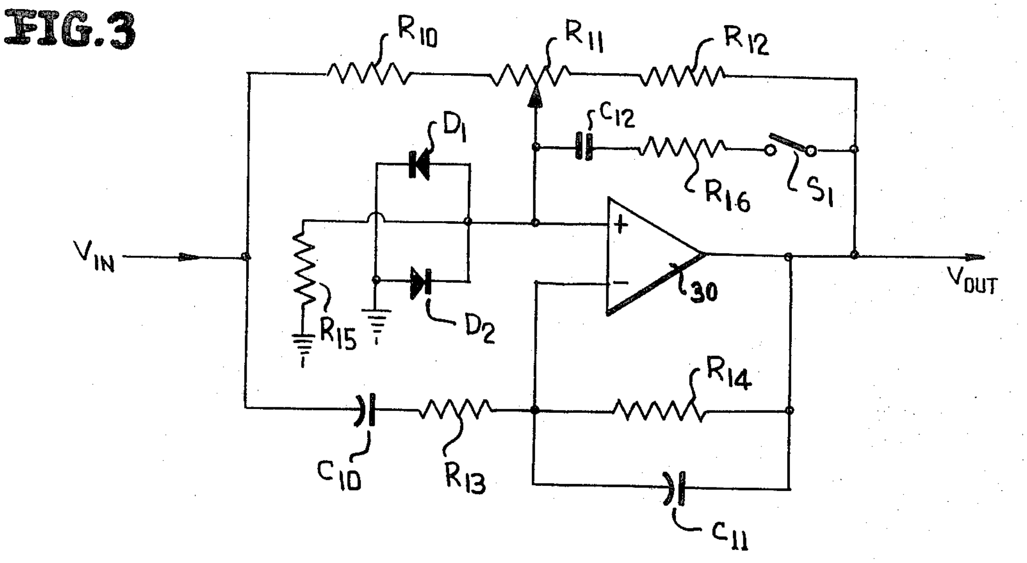

Referring to FIG. 3, the circuit includes an operational amplifier 30 of standard configuration, such as one-third of model L144 AP manufactured by the Siliconix, Inc., Santa Clara, Calif. Suitable bias voltages (not shown) are employed for proper amplifier operation. The amplifier includes a non-inverting input terminal (+), an inverting input terminal (−), and an output terminal. Input signal $V_{in}$ is applied to non-inverting input terminal (+) through series resistor R10 and a portion of potentiometer R11. The non-inverting input terminal (+) is referenced to ground through resistor R15 and also through inverse-parallel-connected diodes D1,D2. A positive or regenerative feedback path includes resistor R12 connected in series with the remainder of potentiometer R11 between the amplifier output terminal and the non-inverting input terminal (+).

Input signal $V_{in}$ is also applied to inverting input terminal (−) through series-connected capacitor C10 and resistor R13. Negative or degenerative feedback is obtained between the amplifier output terminal and inverting input terminal (−) via parallel-connected resistor R14 and capacitor C11.

A series circuit comprising switch S1, resistor R16 and trim capacitor C12 is connected across the regenerative feedback path comprising resistor R12 and thee portion of potentiometer R11 connected in series therewith. Switch S1 is illustrated schematically as a manually operable switch; however it is known in the art that the switching function required of switch S1 can be effected by transistorized or other electronic switches which can, if necessary, respond automatically to a prescribed condition. When switch S1 is open R16 and C12 are not in the circuit and operation ensues in a notch filter mode in the manner described in relation to the circuit of FIG. 2. Upon closure of switch S1, and with proper choice of resistance for R16 relative to R12, the circuit becomes an oscillator which oscillates at the same frequency as the center of the notch provided in the notch filter mode. An analysis of this dual mode of operation is presented in the following paragraphs.

Treating the circuit of FIG. 3 as a linear circuit, the voltage V(+) at the non-inverting input terminal of amplifier 30 may be represented as follows:

$$V(+) = a\ V_{in} + b\ V_{out} \qquad (10)$$

wherein $$a = r_B r_C / r_A r_B + r_A r_C + r_B r_C; \qquad (11)$$

$$b = r_A r_C / r_A r_B + r_A r_C + r_B r_C; \qquad (12)$$

"$r_A$" is the equivalent series input resistance between the input terminal ($V_{in}$) and the non-inverting input terminal (+) (i.e. — R10 plus a portion of R11);

"$r_B$" is the resistance of the regenerative feedback path (i.e. — R12 plus the remainder of R11, all in parallel, or not, with R16); and "$r_C$" is equivalent to R15.

It can be shown that the transfer function for the circuit of FIG. 3 is represented as follows:

$$V_{out}/V_{in} = K\ (p^2 + Y\ p + \omega_n^2)/(p^2 + Z\ p + \omega_n^2) \qquad (13)$$

Where:

$p = j\omega$;

$K$ = a constant determined by $r_A$, $r_B$, $r_C$;

$Y = 1/T \cdot (3 - 1/a)$;

$Z = 1/T \cdot (2 - 3b/1 - b)$;

$T = (R13)(C10) = (R14)(C11)$; and (R13) = (R14); (C10) = (C11)

$\omega_n = 1/T$.

Solving for $Y$ and $Z$ in terms of $r_A$, $r_B$ and $r_C$:

$$Y = 1/T\ (2 - r_A/r_C - r_A/r_B) \qquad (14)$$

$$Z = 1/T\ (2 - 1/1 + (r_A/r_C) \cdot r_A/r_B). \qquad (15)$$

For purposes of simplification, let $C = r_A/r_C$ and $X = r_A/r_B$, then expressions (14) and (15) reduce to $$Y = 1/T\ (2 - C - X) \text{ and} \qquad (16)$$

$$Z = 1/T\ (2 - X/1 + C) \qquad (17)$$

Referring to expression (13), it is noted that at mid-band (i.e. $\omega = \omega_n$), the gain is $Y/Z$. From expressions (16) and (17):

$$Y/Z = (1 + C)(2 - X + C/2 - X - C). \qquad (18)$$

The mid-band gain ($Y/Z$) for the ideal notch filter is zero. Setting expression (18) equal to zero results in:

$$X_o = 2 - C, \qquad (19)$$

from which (substituting for X and C)

$$r_B = r_A r_C / 2r_C - r_A. \qquad (20)$$

Expression (20), therefore, provides a value for $r_B$ (the regenerative feedback resistance) in terms of $r_A$ (the input resistance with the output short circuited) and $r_C$ (i.e. R15) for which the circuit operates as a notch filter.

The mid-band gain ($Y/Z$) is inifinte for an ideal oscillator. Letting expression (18) equal to inifinity results in:

$$X = 2 + C \qquad (21)$$

from which (substituting for $X$ and $C$)

$$r_B = r_A r_C / 2r_C + r_A \qquad (22)$$

Expression (22), therefore, provides a value for $r_B$ in terms of $r_A$ and $r_C$ for which the circuit operates as an oscillator. By proper choice of R10, R11, R12, R15 and R16 according to expressions (20) and (22), the circuit can be made operable as a notch filter and an oscillator, depending upon the position of switch S1.

The following table lists typical component values employed in one working embodiment of the notch filter/oscillator circuit of FIG. 3:

| | |
|---|---|
| R10 | 51.1K |
| R11 | 20K |
| R12 | 24.3K |
| R13 | 196K |
| R14 | 196K |
| R15 | 215K |
| R16 | 60.4K |
| C10 | 390pf |
| C11 | 390pf |
| C12 | 0.01uf |

The function of reverse-parallel connected diodes D1, D2 is to limit the amplitude in the oscillation mode to within the linear operating range of operational amplifier 30. To this end the limiting function need not be served by diodes per se but by any equivalent amplitude limiting circuit.

The component values listed in the foregoing tables are representative of only particular embodiments of the present invention and are not to be construed as limiting upon the scope of the invention. For example, the choice of component values depends on such factors as operating frequency, desired amplitude range, etc.

It should be apparent to those skilled in the art that if the circuit of FIG. 3 is inserted in a communication channel, it serves as a valuable signalling tool. Specifically, when a particular condition is to be signalled on the channel, switch S1 is closed and the circuit provides an oscillatory signal at $\omega_n$ to signify the existence of the condition. When the condition does not exist S1 is opened whereby the circuit operates as a high Q notch filter which blocks signal components at $\omega_n$ so that erroneous signalling cannot be effected by extraneous $\omega_n$ components.

While I have described and illustrated specific embodiments of my invention, it will be clear that variations of the details of construction which are specifically illustrated and described may be resorted to without departing from the true spirit and scope of the invention as defined in the appended claims.

I claim:

1. A notch filter circuit comprising:

a circuit input terminal for receiving input signals referenced to circuit ground;

a circuit output terminal;

a single operational amplifier having an inverting input terminal, a non-inverting input terminal, and an ouput terminal connected to said circuit output terminal;

a first resistive circuit path connected between said circuit input terminal and said non-inverting input terminal;

a second resistive circuit path connected between said non-inverting input terminal and circuit ground;

a further circuit path including a resistor and capacitor connected in series between said circuit input terminal and said inverting input terminal;

a resistive regenerative feedback path connected between said circuit output terminal and said non-inverting input terminal; and a degenerative feedback path including a resistor and capacitor connected in parallel between said circuit output terminal and said inverting input terminal;

wherein the resistors and capacitors in said further circuit path and said degenerative feedback path determine the mid-band frequency of said circuit, and wherein the resistance in said regenerative feedback path is such, relative to the resistance in said first and second resistive circuit paths, that said circuit substantially blocks passage from said circuit input terminal to said circuit output terminal of signal components at said mid-band frequency.

2. The circuit according to claim 1 wherein the series-connected resistor and capacitor in said further circuit path define a time constant which is substantially equal to a time constant defined by the parallel-connected resistor and capacitor in said degenerative feedback path.

3. The circuit according to claim 2 wherein the resistors in said further circuit path and said degenerative feedback path have the same resistance, and the capacitors in said further circuit path and degenerative feedback path have the same capacitance.

4. The circuit according to claim 2 wherein the resistance of said first resistive circuit path is $r_A$, wherein the resistance of said regenerative feedback path is $r_B$, wherein the resistance of said second resistive circuit path is $r_C$, and wherein the value of $(r_B\ r_C)/(r_A r_B + r_A r_C + r_B r_C)$ is approximately equal to $1 - (r_A\ r_C)/(r_A r_B + r_A r_C + r_B r_C)$.

5. The circuit according to claim 4 wherein $r_B r_C / r_A r_B + r_A r_C + r_B r_C$ is approximately equal to one-third.

6. The circuit according to claim 5 further comprising a shunt path connected in parallel with said regenerative feedback path, said shunt path including: switch means arranged for selective activation to alternatively pass and block current flow through said shunt path; and resistive means connected in series with said switch means and having a resistance such that when said switch means is closed said circuit is rendered oscillatory at said mid-band frequency.

7. The circuit according to claim 1 further comprising a shunt path connected in parallel with said regenerative feed-back path, said shunt path including: switch means arranged for selective activation to alternatively pass and block current flow through said shunt path; and resistive means connected in series with said switch means and having a resistance such that when said switch means is closed said circuit is rendered oscillatory at said mid-band frequency.

8. A notch filter/oscillator circuit comprising:

a circuit junction;

a circuit output terminal;

a single operational amplifier having an inverting input terminal, a non-inverting input terminal, and an output terminal connected to said circuit output terminal;

a first resistive circuit path connected between said circuit junction and said non-inverting input terminal;

a second resistive circuit path connected between said non-inverting input terminal and circuit ground;

a further circuit path including a resistor and capacitor connected in series between said circuit junction and said inverting input terminal;

a regenerative feedback path connected between said circuit output terminal and said non-inverting input terminal; and a degenerative feedback path including a resistor and capacitor connected in parallel between said circuit output terminal and said inverting input terminal;

wherein the resistors and capacitors in said further circuit path and said degenerative feedback path determine the mid-band frequency of said circuit;

wherein said regenerative feedback path comprises: a first resistive feedback path connected between said circuit output terminal and said non-inverting input terminal; and a second path including switch means and resistive means connected in series across said first resistive feedback path, said switch means being selectively activable to alternatively block and pass current flow through said resistive means; and wherein the resistance of said regenerative feedback path with said switch means open is such that passage of signal components at said mid-band frequenty is blocked between said circuit junction and said output terminal, and the resistance of said regenerative feedback path with said switch means closed is such that said circuit is rendered oscillatory at said midband frequency.

9. The circuit according to claim 8 wherein the series-connected resistor and capacitor in said further circuit path define a time constant which is substantially equal to a time constant defined by the parallel-connected resistor and capacitor in said degenerative feedback path.

* * * * *